(12) United States Patent
Wang

(10) Patent No.: US 11,562,973 B2
(45) Date of Patent: Jan. 24, 2023

(54) DISPLAY PANEL, MANUFACTURING METHOD OF DISPLAY PANEL, AND DISPLAY DEVICE

(71) Applicant: BOE Technology Group Co., Ltd., Beijing (CN)

(72) Inventor: Dawei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 430 days.

(21) Appl. No.: 16/610,202

(22) PCT Filed: Apr. 18, 2019

(86) PCT No.: PCT/CN2019/083277
§ 371 (c)(1),
(2) Date: Nov. 1, 2019

(87) PCT Pub. No.: WO2019/233198
PCT Pub. Date: Dec. 12, 2019

(65) Prior Publication Data
US 2021/0366850 A1    Nov. 25, 2021

(30) Foreign Application Priority Data
Jun. 8, 2018 (CN) .......................... 201810585220.3

(51) Int. Cl.
*H01L 23/00* (2006.01)
*H01L 27/32* (2006.01)
(Continued)

(52) U.S. Cl.
CPC .............. *H01L 24/02* (2013.01); *H01L 24/03* (2013.01); *H01L 24/05* (2013.01);
(Continued)

(58) Field of Classification Search
CPC . H01L 2224/02206; H01L 2224/0508–05084; H01L 2224/05007; H01L 2224/05018; H01L 2224/05022
See application file for complete search history.

(56) References Cited

U.S. PATENT DOCUMENTS

2006/0175286 A1* 8/2006 Matsushita ............. H01L 27/12
438/720
2013/0134424 A1* 5/2013 Kim ..................... H01L 29/4908
257/E21.409
2014/0159255 A1* 6/2014 Li ........................ G06F 3/0443
257/782

FOREIGN PATENT DOCUMENTS

CN        1504818 A      6/2004
CN      103137630 A      6/2013
(Continued)

OTHER PUBLICATIONS

Mar. 27, 2020—(CN) First Office Action Appn 201810585220.3 with English Translation.
(Continued)

*Primary Examiner* — Amar Movva
(74) *Attorney, Agent, or Firm* — Banner & Witcoff, Ltd.

(57) ABSTRACT

A display panel, a manufacturing method thereof, and a display device are disclosed. The display panel includes: a base substrate, provided with a terminal and a terminal protection layer pattern; the terminal protection layer pattern includes a first shielding region and a first opening region, an orthographic projection of the first shielding region on the base substrate and an orthographic projection of the terminal on the base substrate have an overlapping region, the overlapping region is located at an edge of the orthographic projection of the terminal on the base substrate, and an orthographic projection of the first opening region on the
(Continued)

base substrate is located in the orthographic projection of the terminal on the base substrate.

14 Claims, 6 Drawing Sheets

(51) Int. Cl.
*H01L 51/52* (2006.01)
*H01L 51/56* (2006.01)

(52) U.S. Cl.
CPC ...... *H01L 27/3276* (2013.01); *H01L 51/5253* (2013.01); *H01L 51/56* (2013.01); *H01L 2224/0221* (2013.01); *H01L 2224/02206* (2013.01); *H01L 2224/03019* (2013.01); *H01L 2224/0518* (2013.01); *H01L 2224/05082* (2013.01); *H01L 2224/05083* (2013.01); *H01L 2224/05124* (2013.01); *H01L 2224/05166* (2013.01); *H01L 2224/05573* (2013.01); *H01L 2224/05666* (2013.01); *H01L 2227/323* (2013.01)

(56) References Cited

FOREIGN PATENT DOCUMENTS

| | | |
|---|---|---|
| CN | 103855113 A | 6/2014 |
| CN | 107579040 A | 1/2018 |
| CN | 107910365 A | 4/2018 |
| CN | 108550588 A | 9/2018 |
| JP | 2007036006 A | 2/2007 |

OTHER PUBLICATIONS

Oct. 14, 20204—(CN) Second Office Action 201810585220.3 with English Translation.

\* cited by examiner

DISPLAY PANEL, MANUFACTURING METHOD OF DISPLAY PANEL, AND DISPLAY DEVICE

The application is a U.S. National Phase Entry of International Application No. PCT/CN2019/083277 filed on Apr. 18, 2019, designating the United States of America and claiming priority to Chinese Patent Application No. 201810585220.3, filed Jun. 8, 2018. The present application claims priority to and the benefit of the above-identified applications and the above-identified applications are incorporated by reference herein in their entirety.

TECHNICAL FIELD

Embodiments of the present disclosure relate to a display panel, a manufacturing method of a display panel, and a display device.

BACKGROUND

A display panel generally includes a base substrate and a terminal disposed on the base substrate. After the manufacture of the display panel is completed, it is generally needed to connect the terminal in the display panel with an external control assembly to control a display function of the display panel through the control assembly.

SUMMARY

At least one embodiment of the present disclosure provides a display panel, a manufacturing method of a display panel, and a display device, which can prevent a lateral surface of the terminal in the display panel from being exposed to the external environment to be corroded by water and oxygen in the external environment, and thus avoid the degradation of electrical properties of the terminal.

In order to achieve the above purposes, the embodiments of the present disclosure adopt the following technical solutions.

In a first aspect, at least one embodiment of the present disclosure provides a display panel, the display panel includes: a base substrate, provided with a terminal and a terminal protection layer pattern; the terminal protection layer pattern includes a first shielding region and a first opening region, an orthographic projection of the first shielding region on the base substrate and an orthographic projection of the terminal on the base substrate have an overlapping region, the overlapping region is located at an edge of the orthographic projection of the terminal on the base substrate, and an orthographic projection of the first opening region on the base substrate is located within the orthographic projection of the terminal on the base substrate.

Optionally, the base substrate is further provided with a display structure and a barrier layer pattern, the barrier layer pattern is configured to protect the display structure, and the terminal protection layer pattern is disposed in a same layer with the barrier layer pattern.

Optionally, an opening region is provided between the terminal protection layer pattern and the barrier layer pattern.

Optionally, the base substrate is further provided with a planarization layer protection pattern, the planarization layer protection pattern includes a second shielding region and a second opening region, an orthographic projection of the second shielding region on the base substrate and an orthographic projection of the terminal on the base substrate have an overlapping region, and an orthographic projection of the second opening region on the base substrate is located in the orthographic projection of the terminal on the base substrate.

Optionally, a material of the terminal protection layer pattern includes one selected from the group consisting of silicon nitride, silicon oxide, and silicon oxynitride.

Optionally, a material of the terminal protection layer includes an organic material.

Optionally, the terminal is a multi-layer structure.

Optionally, the terminal includes a titanium structure, an aluminum structure, and a titanium structure which are sequentially arranged in a direction away from the base substrate.

Optionally, a buffer layer, a first gate insulating layer, a gate electrode, a second gate insulating layer, and an inter-layer dielectric layer are sequentially provided on the base substrate, and a through hole is provided in the inter-layer dielectric layer and the second gate insulating layer; the terminal is in contact with the gate electrode through the through hole.

In a second aspect, at least one embodiment of the present disclosure provides a manufacturing method of a display panel; the manufacturing method includes: forming a terminal on a base substrate; and forming a terminal protection layer pattern on the base substrate on which the terminal is formed. Forming the terminal protection layer pattern includes: forming a first shielding region and a first opening region such that an orthographic projection of the first shielding region on the base substrate and an orthographic projection of the terminal on the base substrate have an overlapping region, the overlapping region is located at an edge of the orthographic projection of the terminal on the base substrate, and an orthographic projection of the first opening region on the base substrate is located in the orthographic projection of the terminal on the base substrate.

Optionally, before forming the terminal protection layer pattern on the base substrate on which the terminal is formed, the manufacturing method further includes: forming a display structure on the base substrate. Forming the terminal protection layer pattern on the base substrate on which the terminal is formed includes: forming a barrier layer on the base substrate on which the display structure and the terminal are formed; and processing the barrier layer into a barrier layer pattern and the terminal protection layer pattern, wherein the barrier layer pattern is configured to protect the display structure.

Optionally, processing the barrier layer into the barrier layer pattern and the terminal protection layer pattern includes: forming a photoresist layer on the base substrate on which the barrier layer is formed; exposing and developing the photoresist layer to process the photoresist layer into a photoresist pattern; processing the barrier layer into the barrier layer pattern and the terminal protection layer pattern through an etching process; and removing the photoresist pattern as remained.

Optionally, before forming the terminal protection layer pattern on the base substrate on which the terminal is formed, the manufacturing method further includes: forming a planarization layer protection pattern on the base substrate on which the terminal is formed, the planarization layer protection pattern includes a second shielding region and a second opening region, an orthographic projection of the second shielding region on the base substrate and the orthographic projection of the terminal on the base substrate have an overlapping region, and an orthographic projection of the second opening region on the base substrate is located within the orthographic projection of the terminal on the base substrate. Forming the terminal protection layer pattern on the base substrate on which the terminal is formed includes: forming the terminal protection layer pattern on the base substrate on which the planarization layer protection pattern is formed.

Optionally, before forming the terminal on the base substrate, the manufacturing method further includes: sequentially forming a buffer layer, a first gate insulating layer, a gate electrode, a second gate insulating layer, and an inter-layer dielectric layer on the base substrate, wherein a through hole is formed in the inter-layer dielectric layer and the second gate insulating layer. Forming the terminal on the base substrate includes: forming the terminal on the base substrate on which the inter-layer dielectric layer is formed, the terminal is in contact with the gate electrode through the through hole.

In a third aspect, at least one embodiment of the present disclosure further provides a display device, including the display panel according to the first aspect.

BRIEF DESCRIPTION OF THE DRAWINGS

In order to clearly explain the technical solution in the embodiments of the present disclosure, the drawings necessary for the description of the embodiments will be briefly introduced in the following. Apparently, the drawings in the following are only some embodiments of the present disclosure. For one ordinary skilled in the art, other drawings can be obtained according to these drawings without creative labor. In the drawings.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a", "an", and "the" are not intended to limit the amount, but indicate the existence of at least one. The terms "comprise", "comprising", "include", "including", etc., are intended to specify that the elements or the objects stated before these terms encompass the elements or the objects and equivalents thereof listed after these terms, but do not preclude the other elements or objects. The phrases "on", "under", and the like are only used to indicate relative position relationship, and when the position of the object which is described is changed, the relative position relationship may be changed accordingly.

Figure 1:
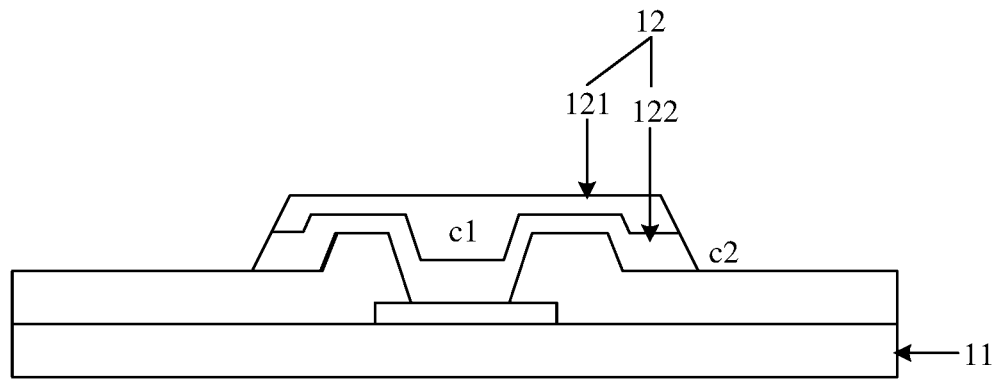
FIG. 1 is a schematic structural diagram of an array substrate.

FIG. 1 is a schematic structural diagram of an array substrate. As illustrated by FIG. 1, the array substrate includes a base substrate 11 on which a terminal 12 is provided. The terminal 12 includes a film layer structure 122 and a terminal protection layer 121. The terminal protection layer 121 is provided on a side c1 of the film layer structure 122 away from the base substrate 11. The terminal protection layer 121 can avoid the problems that, for example, the side c1 of the film layer structure 122 away from the base substrate 11 is oxidized in the external environment due to direct exposure to the external environment.

However, a lateral surface c2 of the film layer structure 122 in the terminal 12 will still be exposed to the external environment. After the lateral surface c2 being corroded by external water and oxygen, the electrical properties of the terminal 12 will be degraded.

At least one embodiment of the present disclosure provides a display panel, a manufacturing method of the display panel, and a display device, which can solve the problems existed in the abovementioned array substrate.

Figure 2:
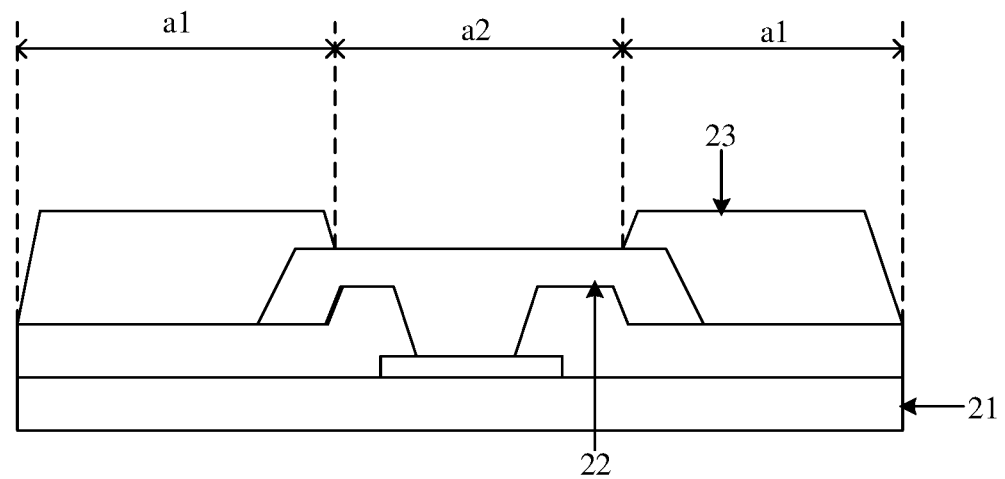
FIG. 2 is a schematic structural diagram of a display panel provided by an embodiment of the present disclosure.

FIG. 2 is a schematic structural diagram of a display panel provided by an embodiment of the present disclosure. As illustrated by FIG. 2, the display panel may include a base substrate 21, and a terminal 22 provided on the base substrate 21. The base substrate 21 provided with the terminal 22 is provided with a terminal protection layer pattern 23. The terminal protection layer pattern 23 includes a first shielding region a1 and a first opening region a2, and an orthographic projection (not illustrated in FIG. 2) of the first shielding region a1 on the base substrate 21 and an orthographic projection (not illustrated in FIG. 2) of the terminal 22 on the base substrate 21 have an overlapping region located at an edge of the orthographic projection of the terminal 22 on the base substrate 21. An orthographic projection (not illustrated in FIG. 2) of the first opening region a2 on the base substrate 21 is located in the orthographic projection (not illustrated in FIG. 2) of the terminal 22 on the base substrate 21.

To sum up, in the display panel provided by the embodiment of the present disclosure, by arranging the terminal protection layer pattern that covers an edge of the terminal on the base substrate provided with the terminal, not only a part of the terminal is exposed to enable the terminal to be electrically connected with an external element, but also a lateral surface of the terminal is prevented from being directly exposed to the external environment so as to avoid the lateral surface of the terminal to be corroded by water and oxygen in the external environment. Therefore, the problem that the electrical properties of the terminal is degraded due to the fact that the lateral surface of the film layer inside the terminal is still exposed to the external environment and is easily corroded by external water and oxygen can be solved, and the effect of preventing the electrical properties of the terminal from being degraded can be achieved.

Figure 3:
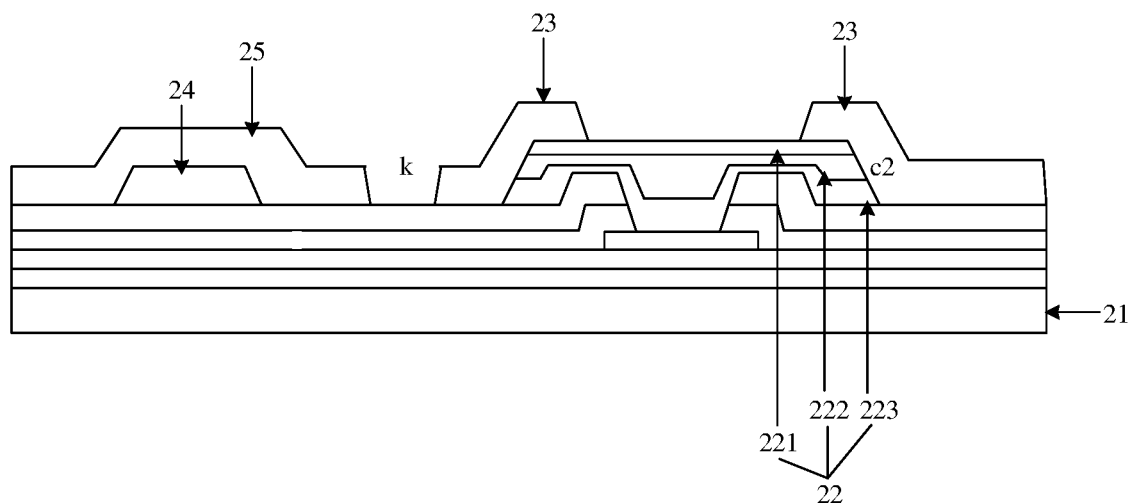
FIG. 3 is a schematic structural diagram of a display panel provided by another embodiment of the present disclosure.

FIG. 3 is a schematic structural diagram of a display panel according to another embodiment of the present disclosure. Different from the embodiment illustrated in FIG. 2, the display panel in the embodiment illustrated in FIG. 3 further includes a display structure and a barrier layer pattern.

As illustrated by FIG. 3, optionally, the base substrate 11 is further provided with a display structure 24. The display structure may be a structure configured to achieve a display function. The display structure may be varied depending on the type of the display panel. By way of example, when the display panel is an organic light-emitting diode (OLED) display panel, the display structure may be a display structure including an organic light emitting structure.

As illustrated by FIG. 3, optionally, the base substrate 21 provided with the display structure 24 and the terminal 22 may also be provided with a barrier layer pattern 25 configured to protect the display structure 24. The barrier layer pattern 25 may be disposed in the same layer with the terminal protection layer pattern 23. The barrier layer pattern 25 may be a protection structure formed by a thin film encapsulation (TFE) technology, and the protection structure may include a single-layer inorganic film, or include a multi-layer constituted by inorganic films, or include a multi-layer constituted by inorganic layer(s) and organic layer(s).

Optionally, the terminal protection layer pattern 23 configured to protect the terminal 22 may be disposed in the same layer with the barrier layer pattern 25 configured to protect the display structure 24, so that the thickness of the entire display panel can be reduced.

Optionally, a material of the terminal protection layer pattern 23 may include one selected from the group consisting of silicon nitride, silicon oxide, and silicon oxynitride. These three inorganic substances have strong barrier ability against water and oxygen, and can prevent external water and oxygen from corroding the terminal through the terminal protection layer pattern 23. In addition, the material of the terminal protection layer pattern 23 may also include an organic material, which is not particularly limited in the embodiments of the present disclosure.

Optionally, the terminal 22 may be disposed in a peripheral region of the display panel, while the display structure 24 may be disposed in a display region of the display panel. The terminal 22 may be configured to be in contact with a COF (Chip On Film), on which a control IC (integrated circuit) can be disposed.

As illustrated by FIG. 3, optionally, an opening region k may be provided between the terminal protection layer pattern 23 and the barrier layer pattern 25. The opening region K can separate the terminal protection layer pattern 23 from the barrier layer pattern 25, reduce the stress of the film layer, and improve the flexibility of the display panel to a certain extent.

As illustrated by FIG. 3, optionally, the terminal 22 may include a titanium structure 223, an aluminum structure 222, and a titanium structure 221 arranged in a sequence. The aluminum structure 222 is more likely to be corroded by external water and oxygen (the corrosion may cause various problems such as galvanic cell corrosion, short circuit and open circuit). The two titanium structures have high stability and strong corrosion resistance, and are difficult to be corroded by external water and oxygen. The titanium structure disposed at the upper side and lower side of the aluminum structure 222 can protect the upper side and lower side of the aluminum structure 222 from other film layers or from water and oxygen in the external environment, but the titanium structure is difficult to protect the lateral surface c2 of the aluminum structure 222 in a direction parallel to the base substrate 21. In the embodiments of the present disclosure, the lateral surface c2 of the aluminum structure 222 in the terminal 22 may be protected by the terminal protection layer pattern 23 covering the terminal 22.

Optionally, the terminal 22 may be disposed in the same layer with a source electrode and a drain electrode, i.e., the terminal 22 may be formed by processing a source-drain metal layer.

Figure 4:
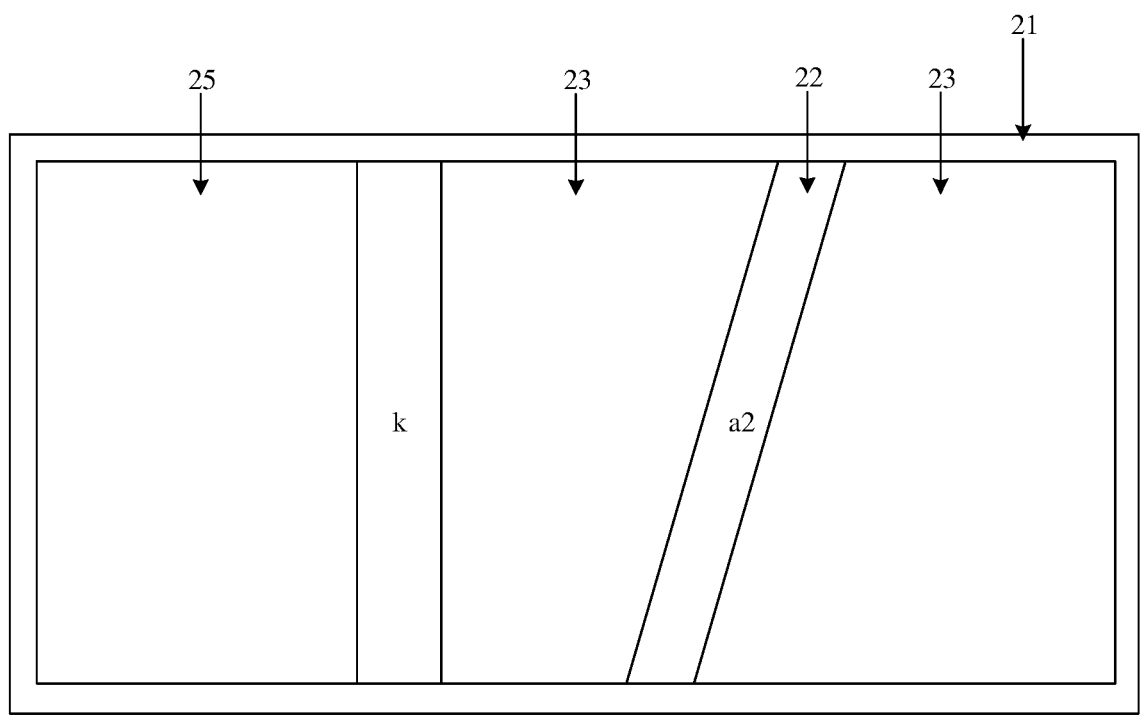
FIG. 4 is a top view of the display panel illustrated in FIG. 3.

FIG. 4 is a top view of the display panel illustrated in FIG. 3. As illustrated by FIG. 4, the terminal protection layer pattern 23 covers an edge of the terminal 22 and exposes a part of the terminal 22. An opening region K is provided between the terminal protection layer pattern 23 and the barrier layer pattern 25. FIG. 4 illustrates the case where an acute angle exists between a length direction of the first opening region a2 and an edge of the base substrate 21, but the length direction of the first opening region a2 may also have an obtuse angle with, perpendicular to or even parallel to the edge of the base substrate 21, which is not particularly limited in the embodiments of the present disclosure.

Figure 5:
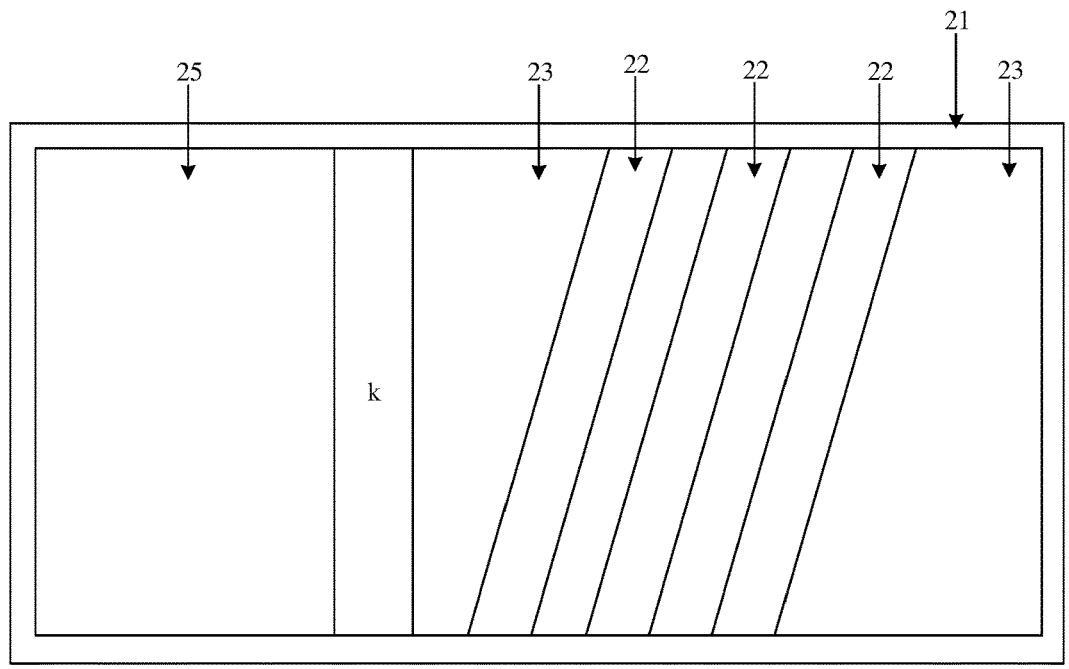
FIG. 5 is a schematic structural diagram of a display panel provided by yet another embodiment of the present disclosure.

Optionally, the display panel may include a plurality of terminals. FIG. 5 is a schematic structural diagram of a display panel according to yet another embodiment of the present disclosure. In the present embodiment, the display panel includes three terminals 22, and the edge of each of the terminals 22 is covered and protected by a terminal protection layer pattern 23. It should be understood by one ordinary skilled person in the art that the number of terminals in the display panel can also be other values.

Figure 6:
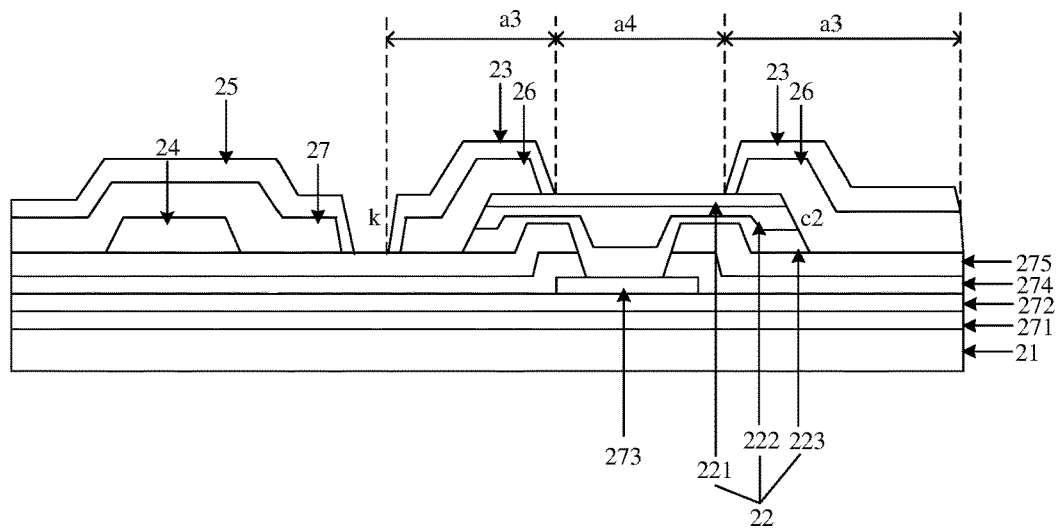
FIG. 6 is a schematic structural diagram of a display panel according to still another embodiment of the present disclosure.

FIG. 6 is a schematic structural diagram of a display panel according to still another embodiment of the present disclosure. As illustrated by FIG. 6, the base substrate 21 provided with the terminal 22 may also be provided with a planarization layer protection pattern 26. Optionally, the planarization layer protection pattern 26 may be disposed in the same layer with the planarization layer pattern 27 disposed on the display structure 24.

As illustrated by FIG. 6, optionally, the planarization layer protection pattern 26 includes a second shielding region a3 and a second opening region a4, an orthographic projection of the second shielding region a3 on the base substrate 21 and an orthographic projection of the terminal 22 on the base substrate 21 have an overlapping region, and an orthographic projection of the second opening region a4 on the base substrate 21 is located in the orthographic projection of the terminal 22 on the base substrate 21.

In this case, the terminal protection layer pattern 23 is provided on the base substrate provided with the planarization layer protection pattern 26. The terminal 22, the display structure 24 and the terminal protection layer pattern 23 in the present embodiment can refer to the description related to FIGS. 2-5, and detailed explanation thereof will be omitted herein.

As described above, in the embodiment of the present disclosure, a planarization layer protection pattern 26 is provided between the terminal protection layer pattern 23 and the terminal 22, which can further improve the protection to a lateral surface of a film layer structure in the terminal and further avoid the degradation of the electrical properties of the terminal 22.

As illustrated by FIG. 6, optionally, a buffer layer 271, a first gate insulating layer 272, a gate electrode 273, a second gate insulating layer 274, and an inter-layer dielectric layer (ILD) 275 may be sequentially disposed on the base substrate 21. The inter-layer dielectric layer 275 and the second gate insulating layer 274 may be provided with a through hole.

In this case, the terminal 22 is in contact with the gate electrode 273 through the through hole in the inter-layer dielectric layer 275 and the second gate insulating layer 274. The material of the gate electrode 273 may include molybdenum metal. Optionally, the gate electrode 273 may also be a part of the terminal 22.

To sum up, in the display panel provided by the embodiment of the present disclosure, by arranging the terminal protection layer pattern that covers the edge of the terminal on the base substrate provided with the terminal, not only a part of the terminal is exposed to enable the terminal to be electrically connected with an external element, but also a lateral surface of the terminal is prevented from being directly exposed to the external environment so as to avoid the lateral surface of the terminal to be corroded by water and oxygen in the external environment. Therefore, the effect of preventing the electrical properties of the terminal from being degraded can be achieved.

Figure 7:
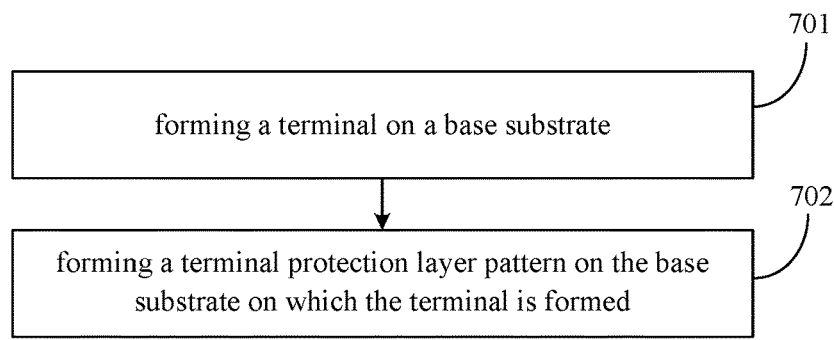
FIG. 7 is a flowchart of a manufacturing method of a display panel according to an embodiment of the present disclosure.

FIG. 7 is a flowchart of a manufacturing method of a display panel according to an embodiment of the present disclosure. As illustrated by FIG. 7, the manufacturing method may include the following steps.

Step 701: forming a terminal on a base substrate.

Step 702: forming a terminal protection layer pattern on the base substrate on which the terminal is formed.

According to the embodiment of the present disclosure, in step 702, forming the terminal protection layer pattern may include: forming a first shielding region and a first opening region such that an orthographic projection of the first shielding region on the base substrate and an orthographic projection of the terminal on the base substrate have an overlapping region, and an orthographic projection of the first opening region on the base substrate is located in the orthographic projection of the terminal on the base substrate.

Details of the terminal and the terminal protection layer pattern in the present embodiment can refer to the description of the terminal 22 and the terminal protection layer pattern 23 related to FIGS. 2-6, and the repeated portions will be omitted herein.

To sum up, in the manufacturing method of the display panel provided by the embodiment of the present disclosure, by forming the terminal protection layer pattern covering the edge of the terminal on the base substrate on which the terminal is formed, not only a part of the terminal is exposed so that the terminal can be electrically connected with an external element, but also a lateral surface of the terminal is prevented from being directly exposed to the external environment so as to avoid the lateral surface of the terminal to be corroded by water and oxygen in the external environment. Therefore, the effect of preventing the electrical properties of the terminal from being degraded can be achieved.

Figure 8:
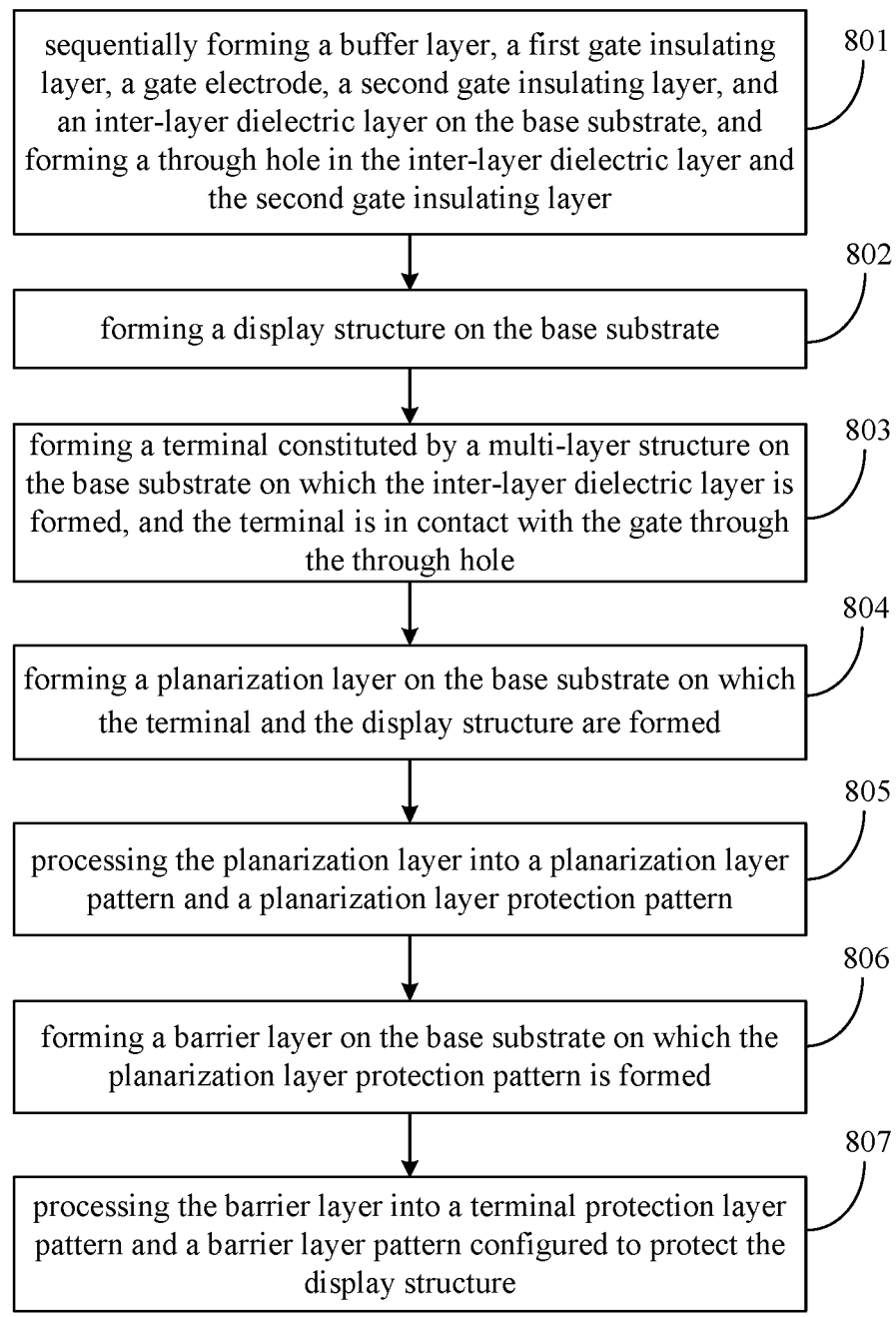
FIG. 8 is a flowchart of a manufacturing method of a display panel provided by another embodiment of the present disclosure.

FIG. 8 is a flowchart of a manufacturing method of a display panel provided by another embodiment of the present disclosure. As illustrated by FIG. 8, the manufacturing method may include the following steps S801-S807.

Step 801: sequentially forming a buffer layer, a first gate insulating layer, a gate electrode, a second gate insulating layer, and an inter-layer dielectric layer on the base substrate, and forming a through hole in the inter-layer dielectric layer and the second gate insulating layer.

The buffer layer, the first gate insulating layer, the gate electrode, the second gate insulating layer, and the inter-layer dielectric layer are all conventional film layer structures in the present technical filed, and the methods and materials of forming these film layer structures can refer to known related technologies, and the repeated portions will be omitted herein.

Step 802: forming a display structure on the base substrate.

The display structure is a structure for achieving a display function in the display panel. By way of example, when the display panel is an OLED display panel, the display structure may include an organic light emitting material, as well as an anode and a cathode disposed on both sides of the organic light emitting material. The display structure may be disposed in a display region of the display panel. The materials and methods of forming the display structure may refer to known related technologies, and the repeated portions will be omitted herein.

Step 803: forming a terminal constituted by a multi-layer structure on the base substrate on which the inter-layer dielectric layer is formed, so that the terminal is in contact with the gate through the through hole.

Optionally, layers in the multi-layer structure may be sequentially formed, by a sputtering process or the like, on the base substrate on which the inter-layer dielectric layer is formed, so as to form the terminal, and the terminal is in contact with the gate electrode through the through hole provided in the inter-layer dielectric layer and the second gate insulating layer.

Optionally, the terminal may be disposed in the same layer with a source electrode and a drain electrode, i.e., the terminal may be formed by processing a source-drain metal layer.

Figure 9:
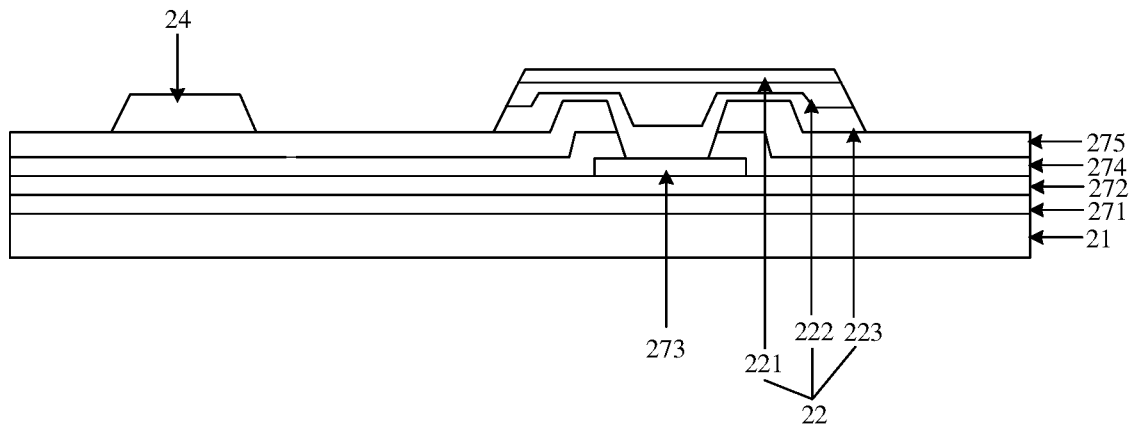
FIG. 9 is a schematic structural diagram of an example of a base substrate in the embodiment illustrated in FIG. 8.

At the end of step 803, the structure of the base substrate may be as illustrated by FIG. 9. A buffer layer 271, a first gate insulating layer 272, a gate electrode 273, a second gate insulating layer 274, and an inter-layer dielectric layer 275 are sequentially formed on the base substrate 21, and a through hole is provided in the inter-layer dielectric layer 275 and the second gate insulating layer 274. The terminal 22 is in contact with the gate 237 through the through hole provided in the inter-layer dielectric layer 275 and the second gate insulating layer 274.

The sequence of forming the display structure and the terminal is not particularly limited in the embodiments of the present disclosure. For example, the display structure can be formed first and then the terminal can be formed. It is also possible to form the terminal before forming the display structure. It is also possible to simultaneously form the terminal and the display structure.

Step 804: forming a planarization layer on the base substrate on which the terminal and the display structure are formed.

The planarization layer can improve the flatness of the film layer in the region where the display structure is located, so as to facilitate the formation of subsequent film layer structures.

Step 805: processing the planarization layer into a planarization layer pattern and a planarization layer protection pattern.

The planarization layer pattern is located in the display region, and the planarization layer protection pattern is configured to protect the terminal. The planarization layer protection pattern includes a second shielding region and a second opening region, an orthographic projection of the second shielding region on the base substrate and an orthographic projection of the terminal on the base substrate have an overlapping region, and an orthographic projection of the second opening region on the base substrate is located in the orthographic projection of the terminal on the base substrate.

For example, the planarization layer may be processed into a planarization layer pattern and a planarization layer protection pattern by a patterning process. The patterning process may include operations such as coating photoresist, exposing photoresist, developing photoresist, etching and stripping photoresist. The specific implementation of the patterning process can refer to known related technologies, and the details thereof will be omitted herein.

The planarization layer pattern is a conventional film layer normally provided in a display panel, thus, in step 805, the manufacturing method of forming the planarization layer pattern and the planarization layer protection pattern through one-step patterning process not only reduces the manufacturing process of the display panel, but also saves additional materials for manufacturing the planarization layer protection pattern.

Figure 10:
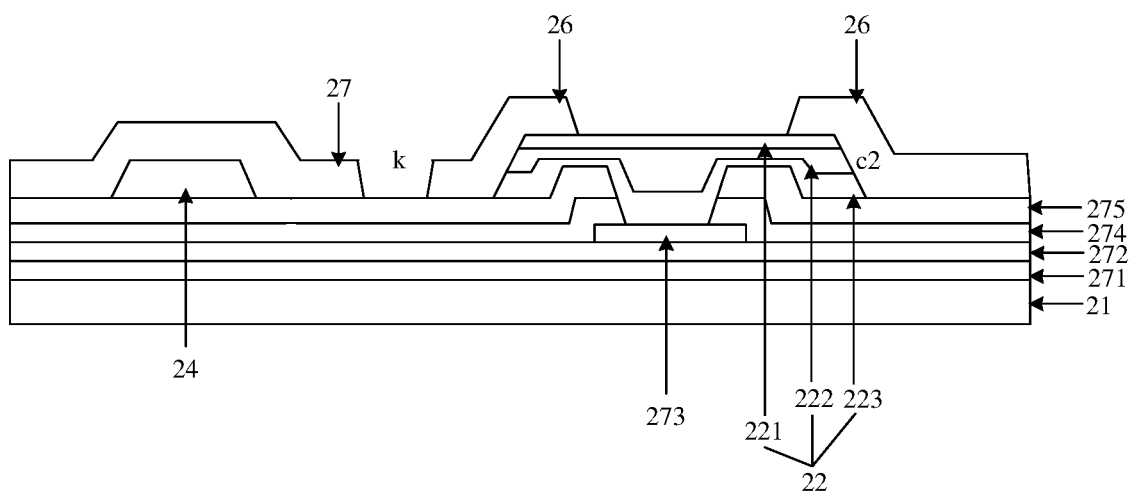
FIG. 10 is a schematic structural diagram of another example of a base substrate in the embodiment illustrated in FIG. 8.

At the end of step 805, the structure of the base substrate may be as illustrated by FIG. 10. A planarization layer pattern 27 and a planarization layer protection pattern 26 are formed on the base substrate on which the terminal 22 and the display structure 24 are formed. Other structures in FIG. 10 can refer to the description related to FIG. 9, and the repeated portions will be omitted herein.

Step 806: forming a barrier layer on the base substrate on which the planarization layer protection pattern is formed.

For example, a barrier layer may be formed, by a thin film encapsulation (TFE) technology, on the base substrate formed with a planarization layer protection pattern. The material of the barrier layer may refer to the previous embodiment, and the repeated portions will be omitted herein.

Step 807: processing the barrier layer into a terminal protection layer pattern and a barrier layer pattern configured to protect the display structure.

For example, the barrier layer may be formed, by a patterning process, on the substrate formed with the planarization layer protection pattern.

Figure 11:
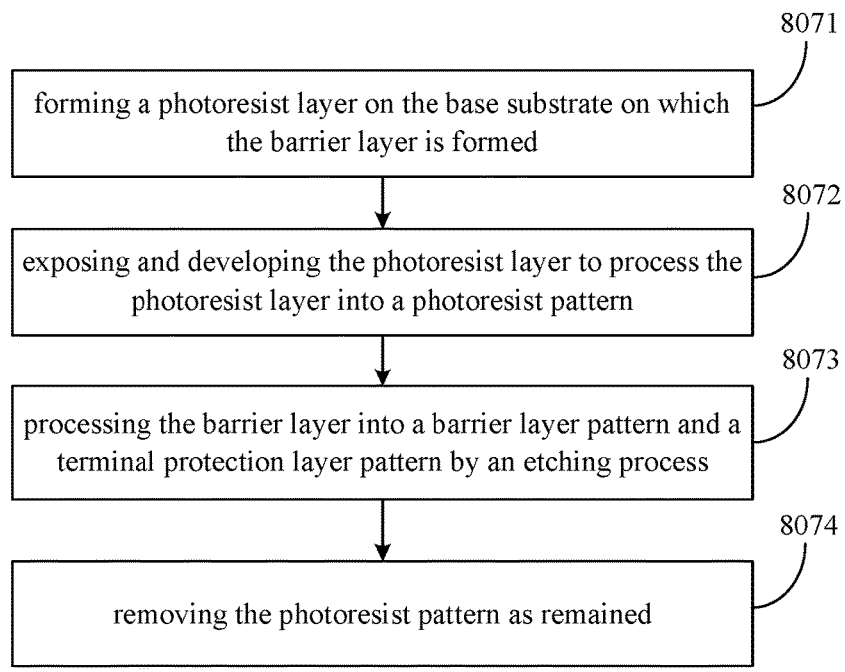
FIG. 11 is a schematic view of forming a barrier layer pattern and a terminal protection layer pattern in the embodiment illustrated in FIG. 8.

For example, as illustrated by FIG. 11, step 807 may include the following sub-steps 8071-8074.

Sub-step 8071: forming a photoresist layer on the base substrate on which the barrier layer is formed.

For example, a photoresist layer may be formed, by a coating process, on the base substrate on which the barrier layer is formed.

Sub-step 8072: exposing and developing the photoresist layer to process the photoresist layer into a photoresist pattern.

Figure 12:
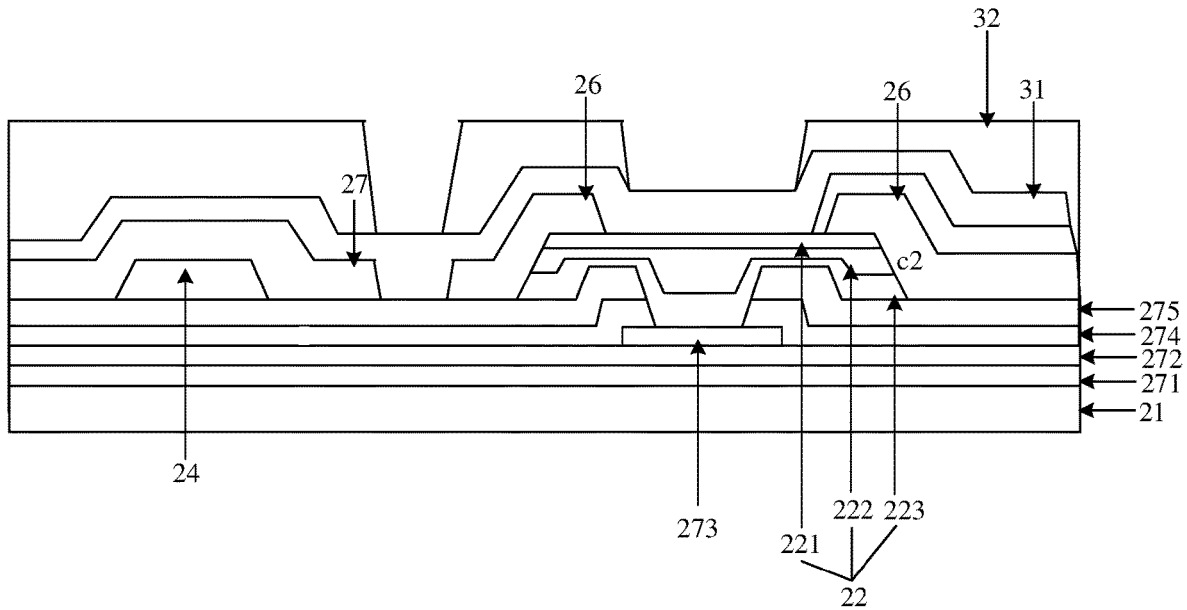
FIG. 12 is a schematic structural diagram of yet another example of a base substrate in the embodiment illustrated in FIG. 8.

At the end of sub-step 8072, the structure of the base substrate may be as illustrated by FIG. 12. A barrier layer 31 is formed on the base substrate 21 on which the planarization layer pattern 27 and the planarization layer protection pattern 26 are formed, and a photoresist pattern 32 is formed on the base substrate 21 on which the barrier layer 31 is formed. Other structures in FIG. 12 can refer to the description related to FIG. 9, and the repeated portions will be omitted herein.

Sub-step 8073: processing the barrier layer into a barrier layer pattern and a terminal protection layer pattern by an etching process.

For example, the barrier layer may be processed into a barrier layer pattern and a terminal protection layer pattern by a wet etching process or a dry etching process.

Sub-step 8074: removing the photoresist pattern as remained.

For example, the photoresist pattern as remained may be stripped from the base substrate by using a stripping liquid.

At the end of sub-step 8074, for example, the structure of the base substrate can be as illustrated by FIG. 6.

The barrier layer pattern is a conventional film layer normally provided in the display panel, thus, in step 807, the manufacturing method of forming the barrier layer pattern and the terminal protection layer pattern through one-step patterning process not only reduces the manufacturing process of the display panel, but also saves additional materials for manufacturing the terminal protection layer pattern.

In the manufacturing method of the display panel provided by the embodiment of the present disclosure, the step of manufacturing the planarization layer protection pattern is an optional step, that is, the planarization layer protection pattern may not be formed between the terminal and the terminal protection pattern. Accordingly, the structure of the manufactured display panel that does not include the planarization layer protection pattern may be as illustrated by FIG. 3.

To sum up, in the manufacturing method of the display panel provided by the embodiment of the present disclosure, by arranging the terminal protection layer pattern that covers the edge of the terminal on the base substrate on which the terminal is formed, not only a part of the terminal is exposed so that the terminal can be electrically connected with an external element, but also a lateral surface of the terminal is prevented from being directly exposed to the external environment so as to avoid the lateral surface of the terminal to be corroded by water and oxygen in the external environment. Thus, the effect of preventing the electrical properties of the terminal from being degraded can be achieved.

Additionally, an embodiment of the present disclosure further provides a display device, which may include the display panel described in any of the preceding embodiments or examples.

The foregoing is only embodiments of the present disclosure, but the protection scope of the present disclosure is not limited thereto. Any modifications or alternations easily envisaged by one person skilled in the art within the technical scope of the present disclosure should fall within the protection scope of the present disclosure. Therefore, the protection scope of the present disclosure should be based on protection scope of the claims.

The present application claims priority of China Patent application No. 201810585220.3 filed on Jun. 8, 2018, the content of which is incorporated in its entirety as portion of the present application by reference herein.

What is claimed is:

1. A display panel, comprising:
a base substrate, provided with a terminal and a terminal protection layer pattern, wherein the terminal protection layer pattern comprises a first shielding region and a first opening region, an orthographic projection of the first shielding region on the base substrate and an orthographic projection of the terminal on the base substrate have an overlapping region, the overlapping region is located at an edge of the orthographic projection of the terminal on the base substrate, and an orthographic projection of the first opening region on the base substrate is located in the orthographic projection of the terminal on the base substrate, wherein the base substrate is further provided with a display structure and a barrier layer pattern, the barrier layer pattern is configured to protect the display structure, and the terminal protection layer pattern is disposed in a same layer with the barrier layer pattern, wherein a second opening region is provided between the terminal protection layer pattern and the barrier layer pattern, and wherein the orthographic projection of the first opening region on the base substrate has no overlap with an orthographic projection of the second opening region on the base substrate.

2. The display panel according to claim 1, wherein the base substrate is further provided with a planarization layer protection pattern, the planarization layer protection pattern comprises a second shielding region and a third opening region, an orthographic projection of the second shielding region on the base substrate and the orthographic projection of the terminal on the base substrate have an overlapping region, and an orthographic projection of the third opening region on the base substrate is located in the orthographic projection of the terminal on the base substrate.

3. The display panel according to claim 2, wherein a buffer layer, a first gate insulating layer, a gate electrode, a second gate insulating layer, and an inter-layer dielectric layer are sequentially provided on the base substrate, and a through hole is provided in the inter-layer dielectric layer and the second gate insulating layer; and the terminal is in contact with the gate electrode through the through hole.

4. The display panel according to claim 1, wherein a material of the terminal protection layer pattern comprises one selected from the group consisting of silicon nitride, silicon oxide, and silicon oxynitride.

5. The display panel according to claim 1, wherein a material of the terminal protection layer pattern comprises an organic material.

6. The display panel according to claim 1, wherein the terminal is a multi-layer structure.

7. The display panel according to claim 6, wherein the terminal comprises a titanium structure, an aluminum structure, and a second titanium structure which are sequentially arranged in a direction away from the base substrate.

8. The display panel according to claim 1, wherein a buffer layer, a first gate insulating layer, a gate electrode, a second gate insulating layer, and an inter-layer dielectric layer are sequentially provided on the base substrate, and a through hole is provided in the inter-layer dielectric layer and the second gate insulating layer; and the terminal is in contact with the gate electrode through the through hole.

9. A display device, comprising the display panel according to claim 1.

10. A manufacturing method of a display panel, comprising:

forming a terminal on a base substrate; and forming a terminal protection layer pattern on the base substrate on which the terminal is formed, wherein the forming the terminal protection layer pattern comprises: forming a first shielding region and a first opening region such that an orthographic projection of the first shielding region on the base substrate and an orthographic projection of the terminal on the base substrate have an overlapping region, the overlapping region is located at an edge of the orthographic projection of the terminal on the base substrate, and an orthographic projection of the first opening region on the base substrate is located in the orthographic projection of the terminal on the base substrate, wherein before the forming the terminal protection layer pattern on the base substrate on which the terminal is formed, the manufacturing method further comprises: forming a display structure on the base substrate, the forming the terminal protection layer pattern on the base substrate on which the terminal is formed further comprises: forming a barrier layer on the base substrate on which the display structure and the terminal are formed; and processing the barrier layer into a barrier layer pattern and the terminal protection layer pattern, and wherein the barrier layer pattern is configured to protect the display structure, wherein the terminal protection layer pattern is disposed in a same layer with the barrier layer pattern, and a second opening region is provided between the terminal protection layer pattern and the barrier layer pattern, and the orthographic projection of the first opening region on the base substrate has no overlap with an orthographic projection of the second opening region on the base substrate.

11. The manufacturing method according to claim 10, wherein the processing the barrier layer into the barrier layer pattern and the terminal protection layer pattern comprises:

forming a photoresist layer on the base substrate on which the barrier layer is formed;

exposing and developing the photoresist layer to process the photoresist layer into a photoresist pattern;

processing the barrier layer into the barrier layer pattern and the terminal protection layer pattern through an etching process; and removing the photoresist pattern.

12. The manufacturing method according to claim 10, wherein before the forming the terminal protection layer pattern on the base substrate on which the terminal is formed, the manufacturing method further comprises: forming a planarization layer protection pattern on the base substrate on which the terminal is formed, wherein the planarization layer protection pattern comprises a second shielding region and a third opening region, an orthographic projection of the second shielding region on the base substrate and the orthographic projection of the terminal on the base substrate have an overlapping region, and an orthographic projection of the third opening region on the base substrate is located within the orthographic projection of the terminal on the base substrate; and the forming the terminal protection layer pattern on the base substrate on which the terminal is formed comprises: forming the terminal protection layer pattern on the base substrate on which the planarization layer protection pattern is formed.

13. The manufacturing method according to claim 10, wherein before the forming the terminal on the base substrate, the manufacturing method further comprises: sequentially forming a buffer layer, a first gate insulating layer, a gate electrode, a second gate insulating layer, and an inter-layer dielectric layer on the base substrate, wherein a through hole is formed in the inter-layer dielectric layer and the second gate insulating layer; and the forming the terminal on the base substrate comprises: forming the terminal on the base substrate on which the inter-layer dielectric layer is formed, wherein the terminal is in contact with the gate electrode through the through hole.

14. The manufacturing method according to claim 12, wherein before the forming the terminal on the base substrate, the manufacturing method further comprises: sequentially forming a buffer layer, a first gate insulating layer, a gate electrode, a second gate insulating layer, and an inter-layer dielectric layer on the base substrate, wherein a through hole is formed in the inter-layer dielectric layer and the second gate insulating layer; and the forming the terminal on the base substrate comprises: forming the terminal on the base substrate on which the inter-layer dielectric layer is formed, wherein the terminal is in contact with the gate electrode through the through hole.

* * * * *